United States Patent [19]

Inoue et al.

[11] Patent Number: 5,049,957
[45] Date of Patent: Sep. 17, 1991

[54] MOS TYPE DYNAMIC RANDOM ACCESS MEMORY

[75] Inventors: Satoshi Inoue; Akihiro Nitayama, both of Kawasaki; Kazumasa Sunouchi, Yokohama; Fumio Horiguchi, Tokyo, all of Japan

[73] Assignee: Kabushiki Kaisha Toshiba, Kawasaki, Japan

[21] Appl. No.: 528,086

[22] Filed: May 24, 1990

[30] Foreign Application Priority Data

May 26, 1989 [JP] Japan .................................. 1-134094

[51] Int. Cl.⁵ ..................... H01L 29/68; H01L 27/02; H01L 21/70
[52] U.S. Cl. ..................... 357/23.6; 357/51; 357/41; 437/52
[58] Field of Search ..................... 357/23.6, 51; 437/52

[56] References Cited

U.S. PATENT DOCUMENTS 4,700,457 10/1987 Matsukawa ..................... 357/23.6

FOREIGN PATENT DOCUMENTS 63-58958 3/1988 Japan ..................... 357/23.6

OTHER PUBLICATIONS

T. Kisu et al., "A Novel Storage Capacitance Enlargement Structure Using a Double-Staked Storage Node in STC DRAM Cell", Extended Abstracts of the 20th (1988 International) Conference on Solid State Devices and Materials, 1988, pp. 581-584.

W. Wakamiya et al., "Novel Stacked Capacitor Cell for 64Mb DRAM", 1989 Symposium on VLSI Technology, May 1989, pp. 69-70.

Primary Examiner—Rolf Hille
Assistant Examiner—Robert P. Limanek
Attorney, Agent, or Firm—Finnegan, Henderson, Farabow, Garrett, and Dunner

[57] ABSTRACT

In a semiconductor memory device, a storage node electrode having a cavity is provided such that the inner surface of a storage node electrode is used as a capacitor electrode. In a DRAM fabricating method, a storage node electrode having a cavity is formed by laminating a first conductor layer, an insulating film and a second conductor layer, which in turn are patterned into a desired shape, depositing a third conductor layer on the three-layer pattern, performing anisotropic etching so as to cause the third conductor layer to remain only on the side walls of the pattern to thereby form a box-shaped conductor, forming an opening in a part of the box-shaped conductor, removing the insulating film by an etching to thereby form a cavity.

11 Claims, 16 Drawing Sheets

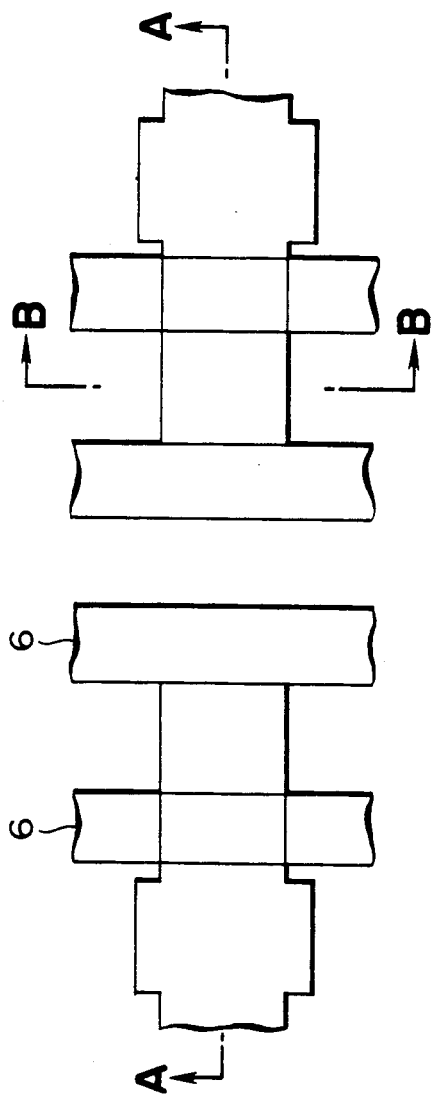
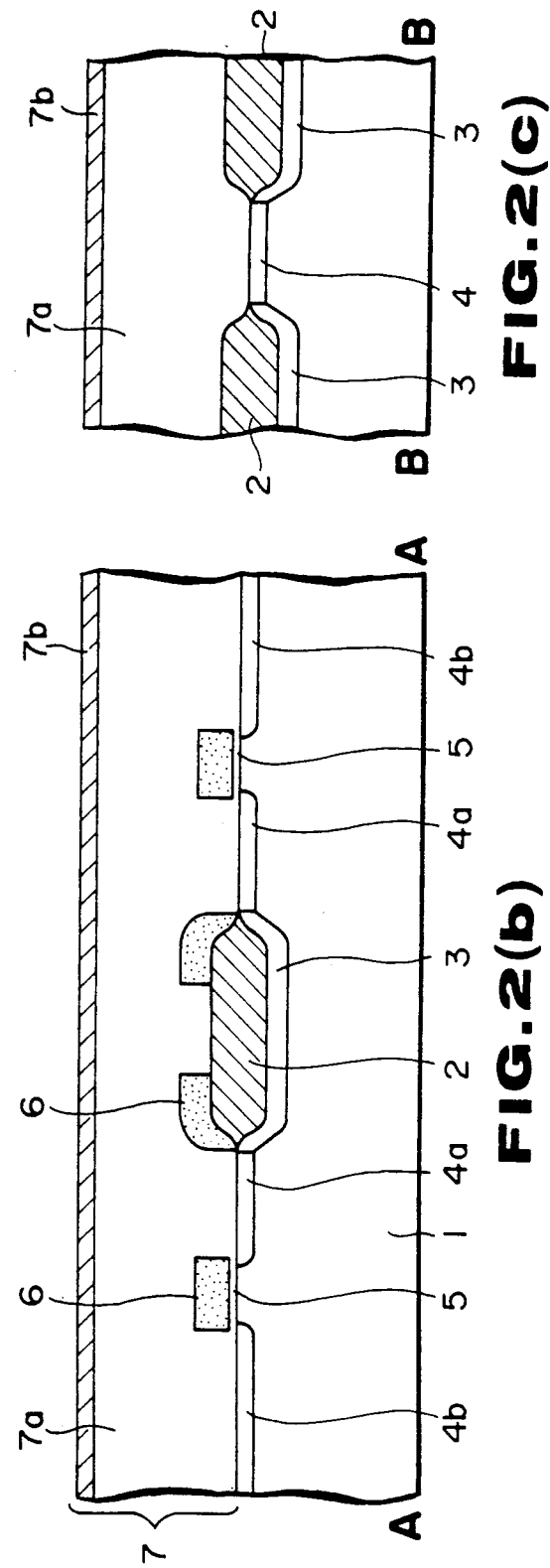
FIG.2(a)
FIG.2(b)
FIG.2(c)

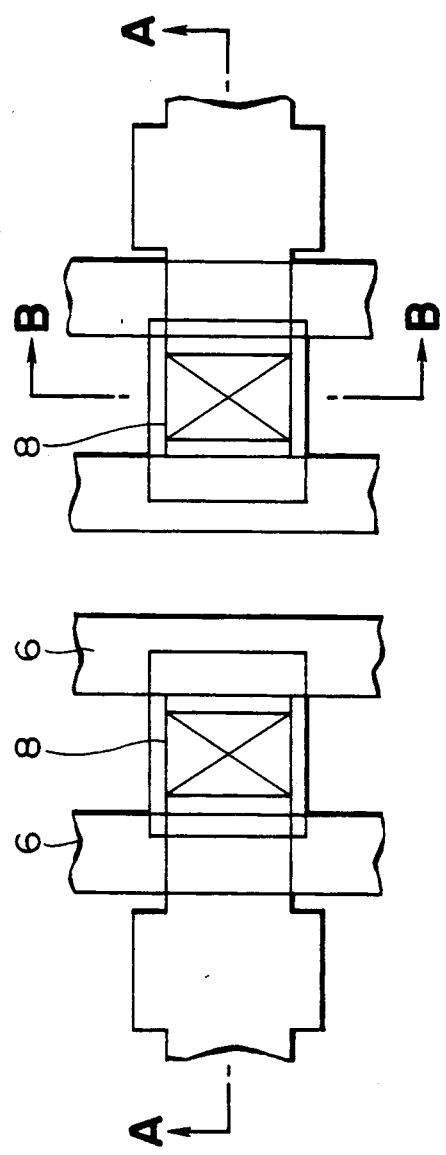
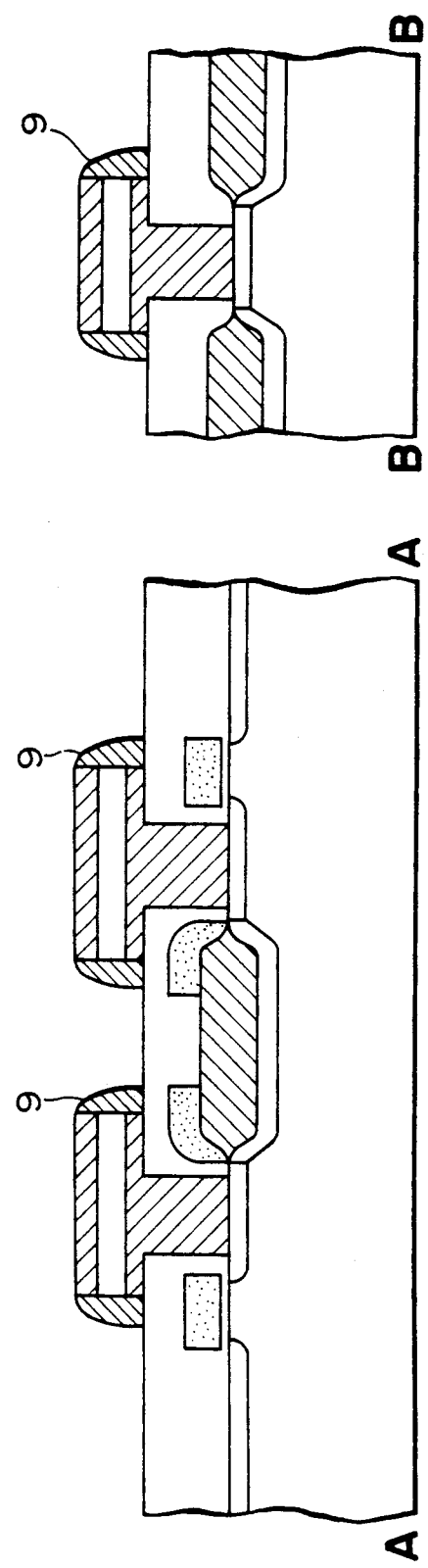
FIG.5(a)
FIG.5(b)
FIG.5(c)

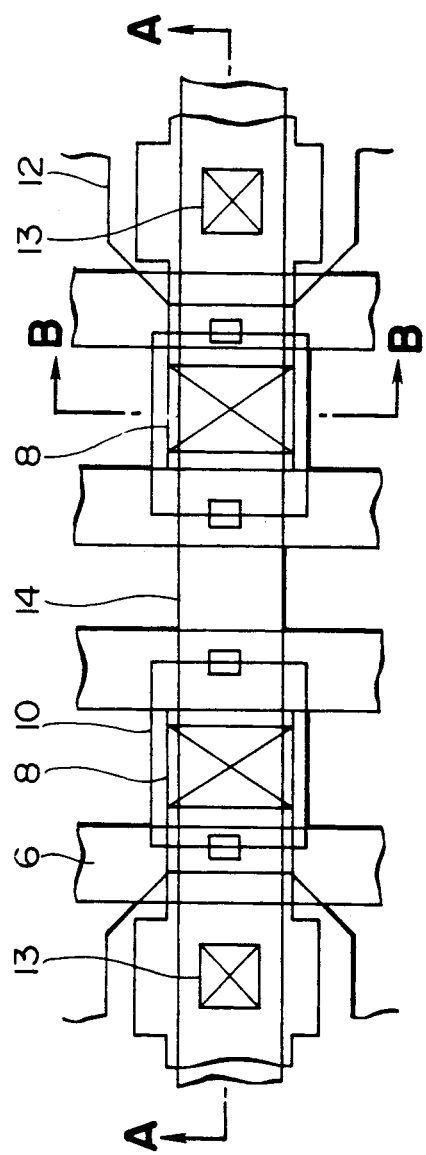
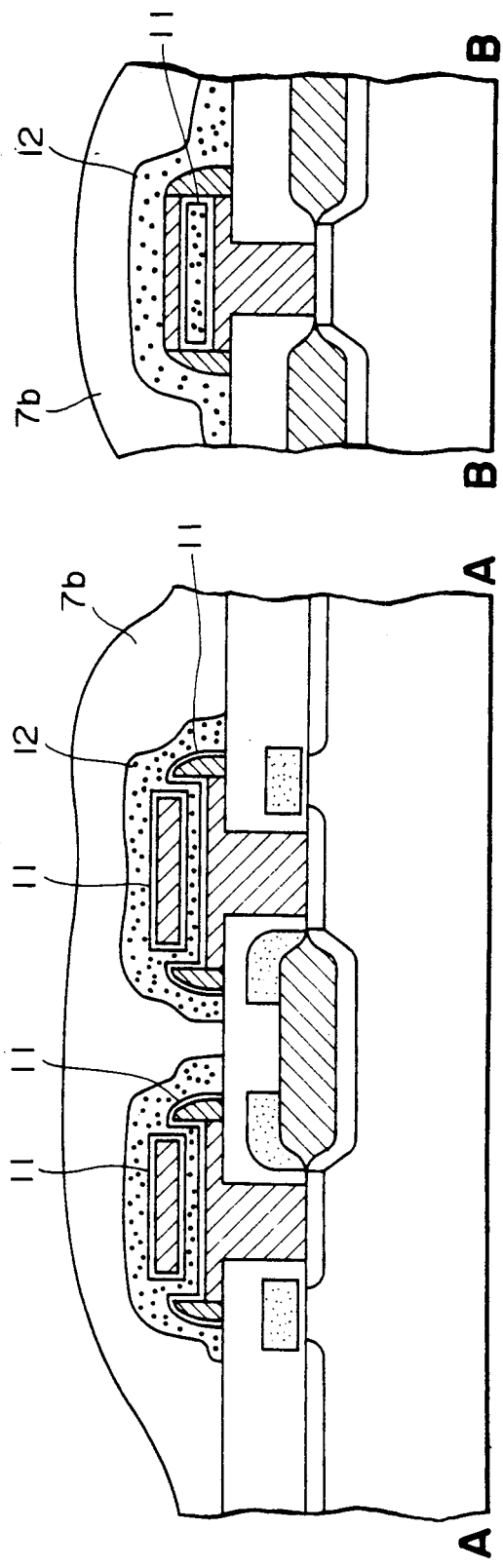
FIG.7(a)
FIG.7(b)
FIG.7(c)

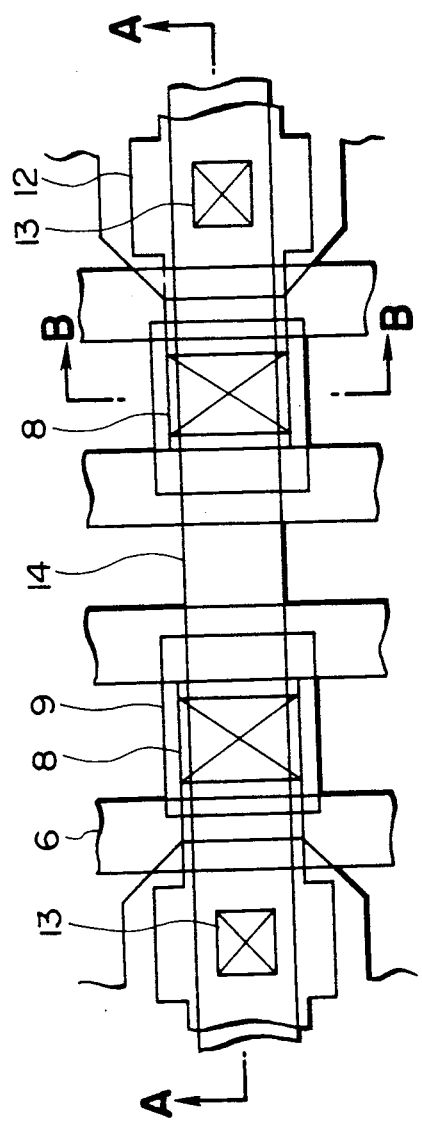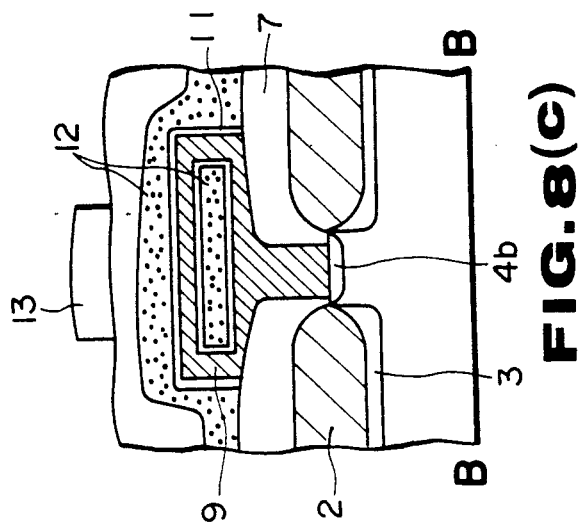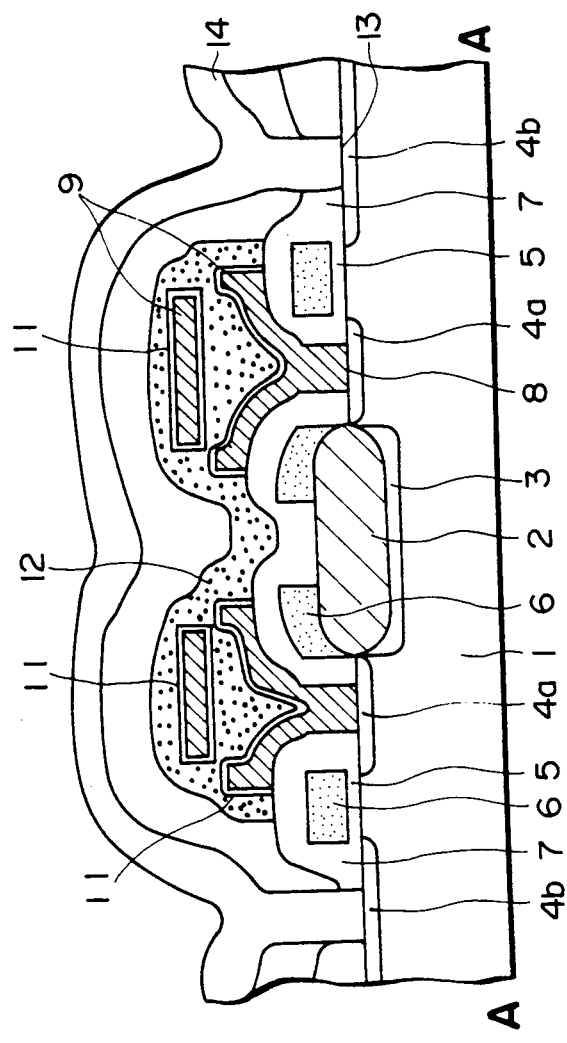

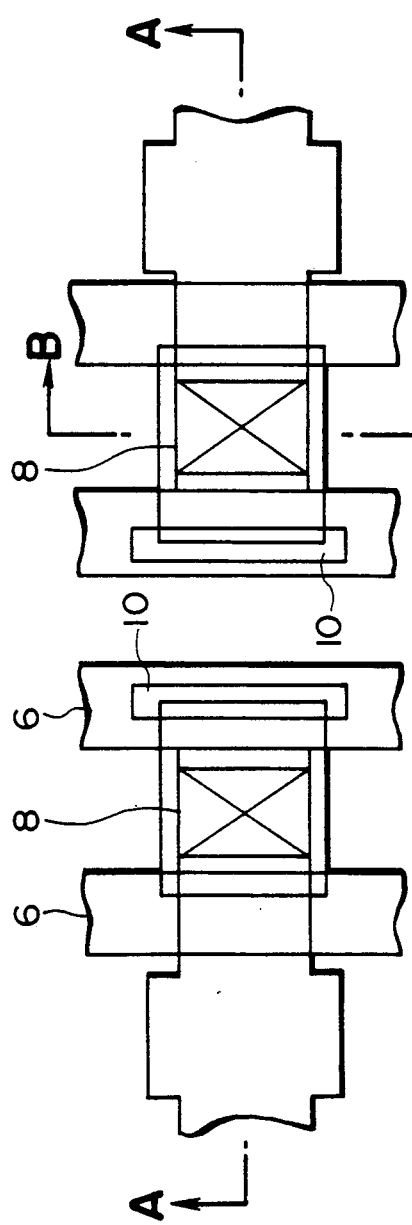
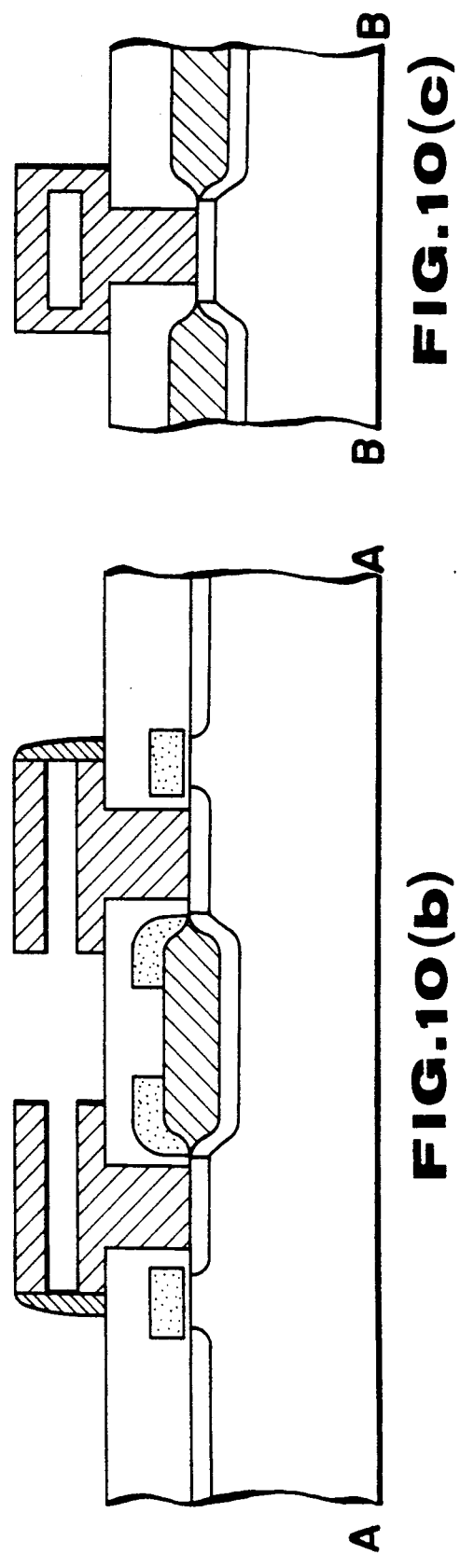
FIG.10(a)
FIG.10(b)
FIG.10(c)

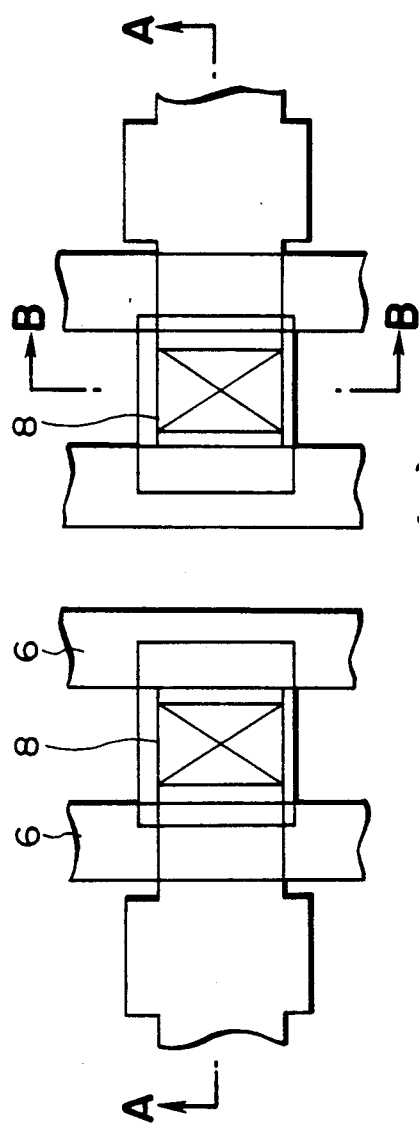
FIG.11(a)
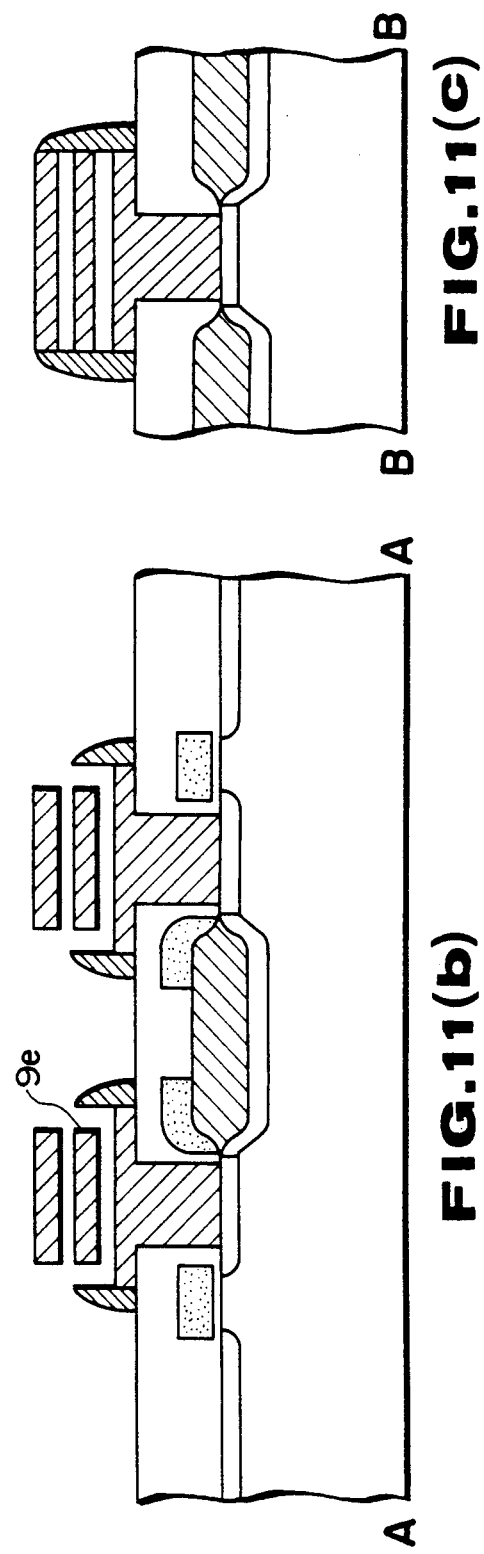
FIG.11(b)
FIG.11(c)

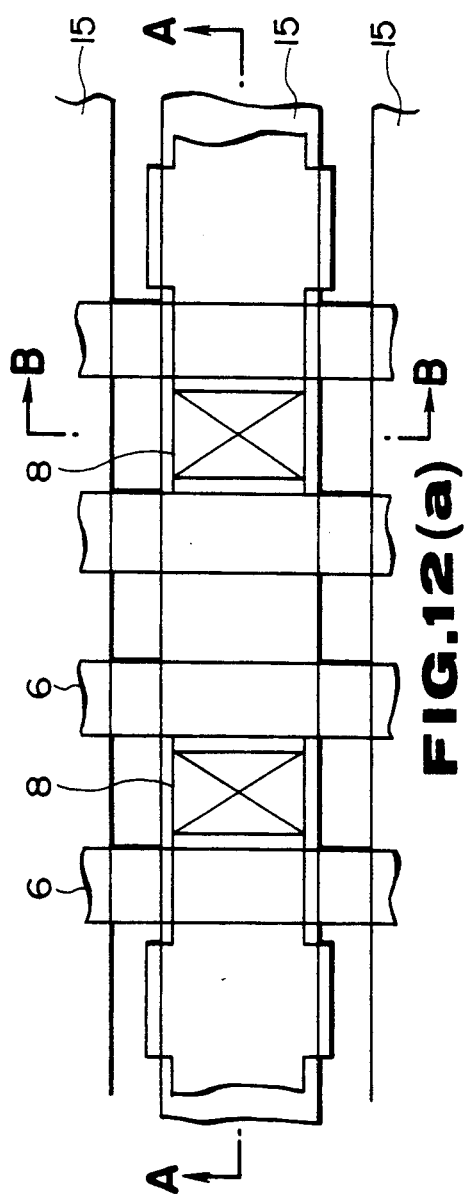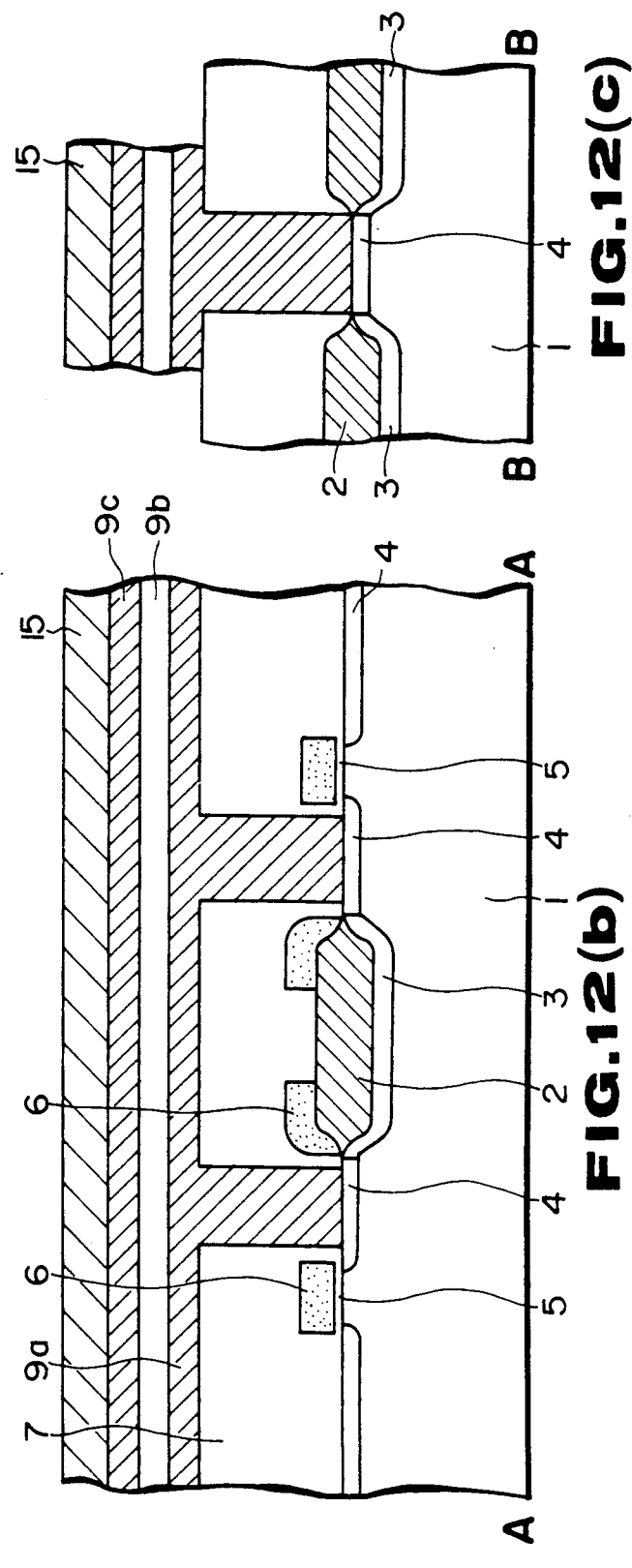
FIG.12(a)
FIG.12(b)
FIG.12(c)

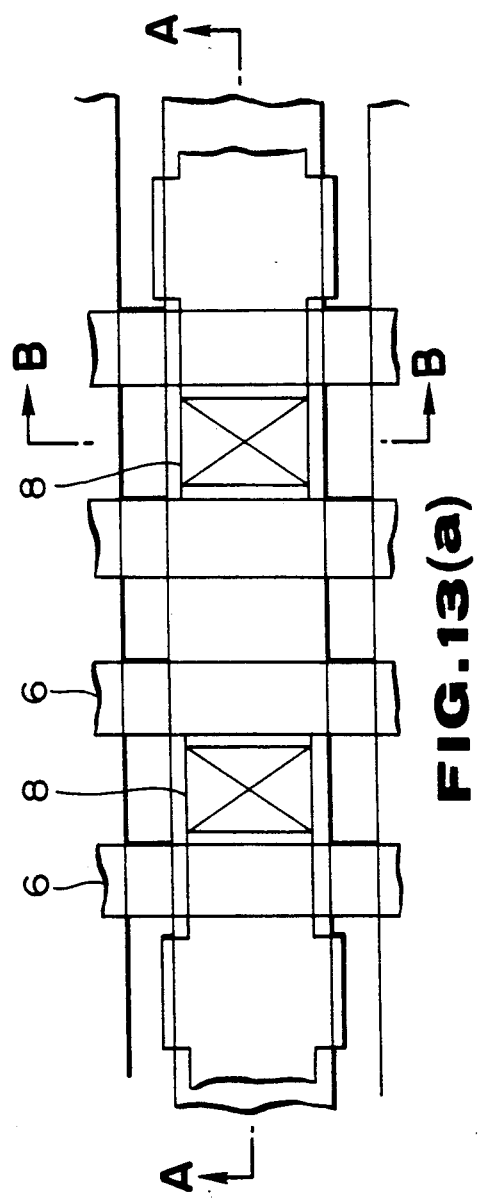
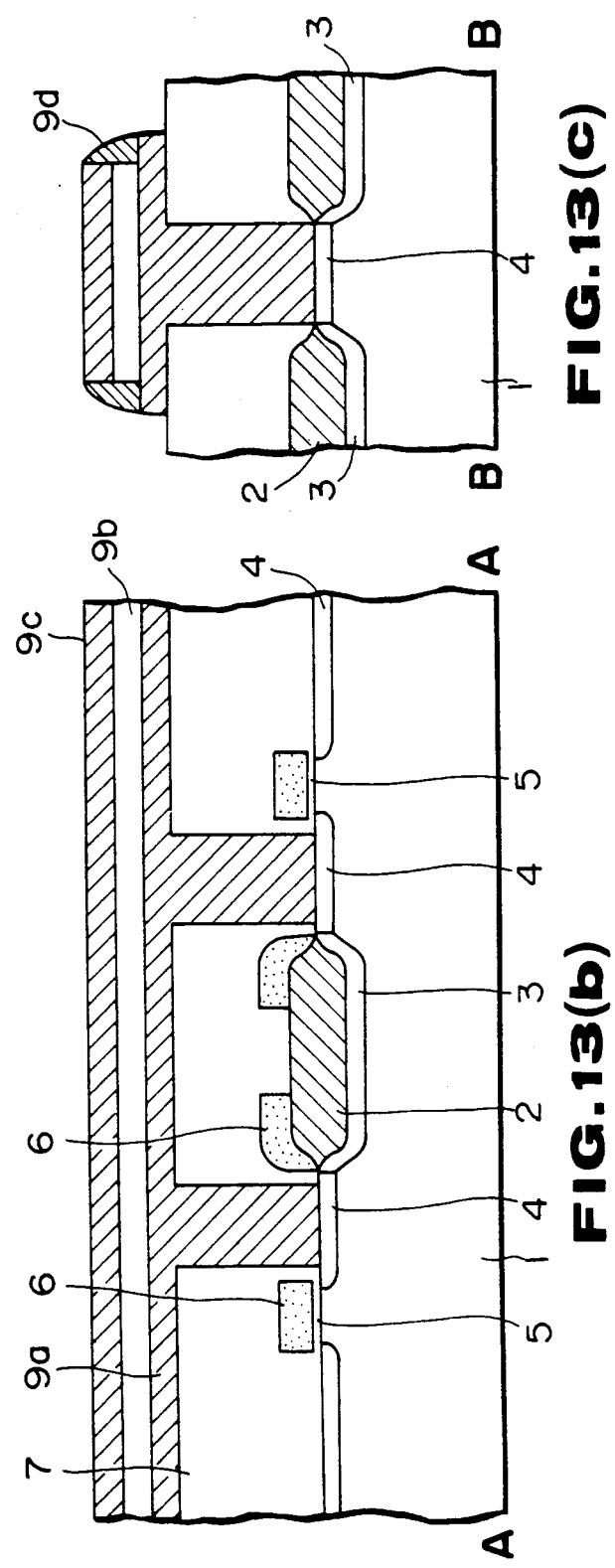
FIG.13(a)
FIG.13(b)
FIG.13(c)

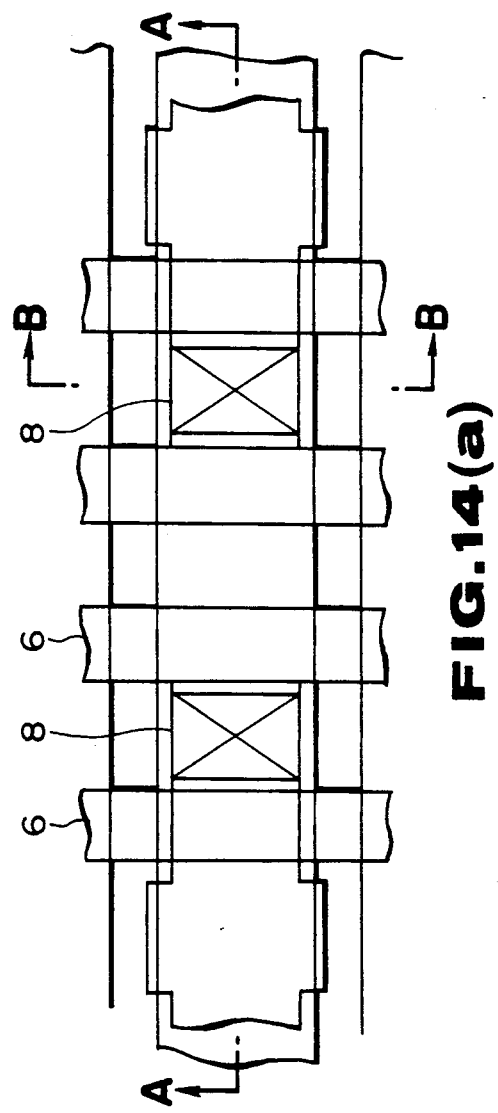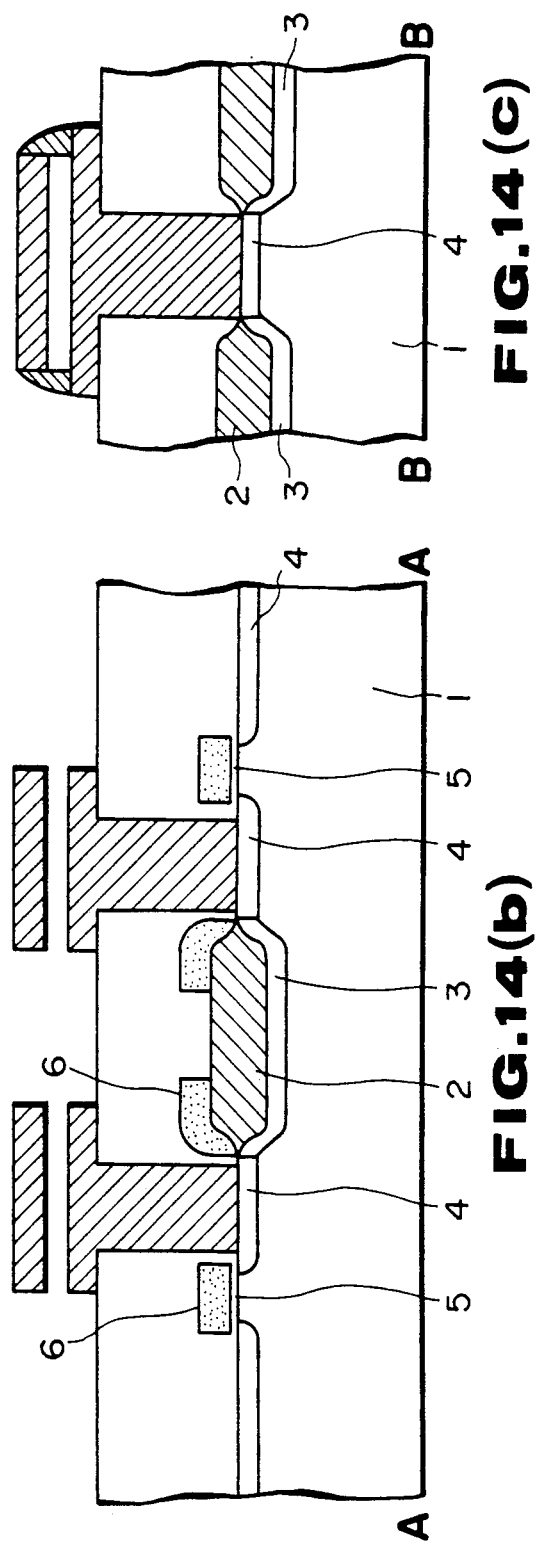

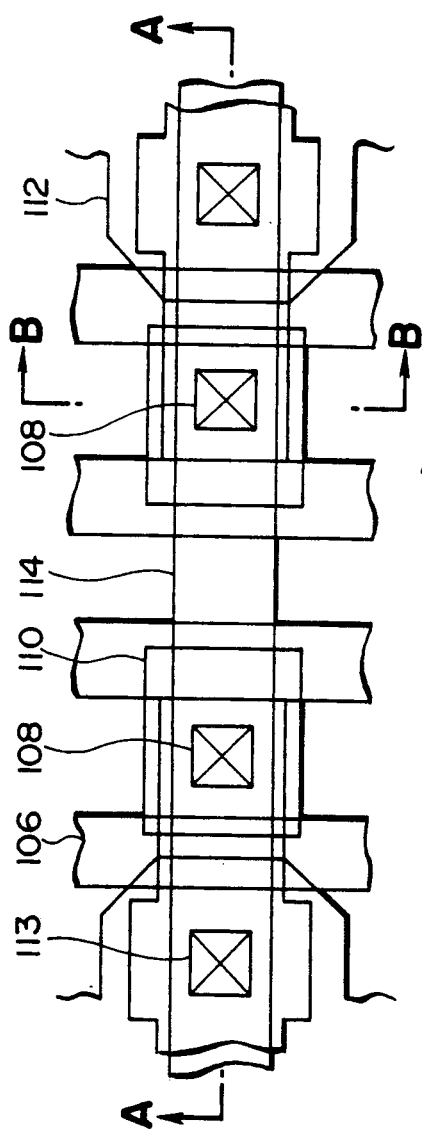
FIG.15(a)
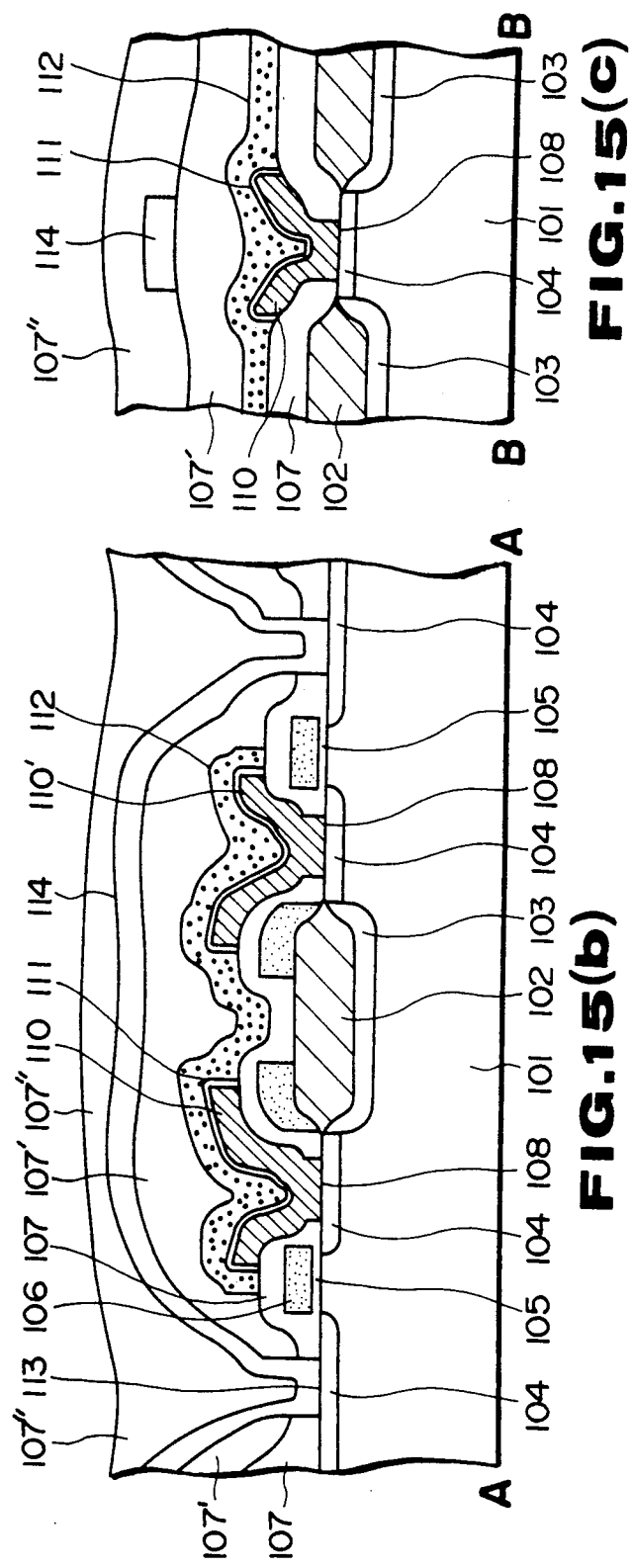
FIG.15(b)
FIG.15(c)

MOS TYPE DYNAMIC RANDOM ACCESS MEMORY

BACKGROUND OF THE INVENTION

1. Field of the Invention

The present invention relates to a semiconductor memory device and its fabricating method and more particularly, to a capacitor structure and a storage node electrode structure in a DRAM.

2. Description of the Related Art

Recently, MOS type DRAM technology has made remarkable progress in providing high integration and large capacity of memory cells with the advancement of semiconductor techniques, particularly fine processing techniques.

However, the high memory integration presents a problem in that the area of a capacitor for storing data (charges) is decreased and this results in erroneous reading operation of the memory contents or in the generation of a soft error caused by the destruction of the memory contents due to $\alpha$ rays or the like. Further, the high integration and large capacity have led to another problem that the gate length of a transistor is shortened and thus the reliability is lowered.

For the purpose of solving such problems and realizing the higher integration and increased capacity, there have been suggested various methods of forming on a silicone substrate, storage nodes made of polycrystalline silicon or the like so as to enlarge an area for the capacitors, thus increasing the capacitance of the capacitors.

Further, a laminated memory cell structure has been proposed, in which a MOS capacitor is formed on a memory cell zone and one electrode of the capacitor is electrically connected to one electrode of a switching transistor formed on a semiconductor substrate to thereby substantially increase the electrostatic capacitance of the MOS capacitor.

Such laminated memory cell is shown in FIG. 15. In more detail, one memory cell area is provided by isolating a p-type silicone substrate 101 with an insulating film 102. In the memory cell area, a gate electrode 106 is formed between adjacent source/drain regions 104 of an n-type diffusion layer with a gate insulating film 105 disposed between the gate electrode 106 and source/drain regions 104, thereby forming a MOSFET as a switching transistor. Further formed on the MOSFET is a first capacitor electrode 110. The first capacitor electrode 110 is contacted through its storage node contact hole 108 provided in an insulating film 107 with one of the source/drain regions of the MOSFET, and covers the gate electrode 106 of the MOSFET and a gate electrode (word line) of an adjacent MOSFET. An insulating film 111 and a second capacitor electrode 112 are sequentially laminated on the first capacitor electrode 110 to thereby form a capacitor. Reference numerals 107' and 107" denote inter-layer insulating films, 113 a bit line contact hole and 114 a bit line.

The laminated memory cell is fabricated in the following manner.

First, in a memory cell zone defined by the insulating film 102 formed in the p-type silicone substrate 101, a gate electrode is formed on the substrate by the gate insulating film 105, and then source/drain regions 104a and 104b in the form of an n-type diffusion layer are formed. Thus, a MOSFET as a switching transistor is formed.

Then, the insulating film 107 made of an silicon oxide is formed on the MOSFET. In the insulating film 107, a storage node contact hole 108 for contact with the source drain region 104b is formed. Then a pattern of first capacitor electrode 110 made of a heavily doped polycrystalline silicon film is formed.

Subsequently, on the first capacitor electrode 110, a capacitor insulating film 111 of silicon oxide and a polycrystalline silicon film are sequentially deposited.

Finally, the polycrystalline silicon film is subjected to a doping process and then to photolithographic and reactive ion etching processes to obtain a pattern of second capacitor plate electrode 112. At this stage, a MOS capacitor is formed and the basic structure of a cell part is completed.

With such a structure, the storage node electrode can be extended up to a position above the element isolation zone and the step difference of the storage electrode can be utilized, whereby the capacitance of the capacitor can be increased several to several tens of times than that of a planar structure type.

A DRAM of such a laminated memory cell structure type, however, has the following disadvantage. As the memory integration is advanced and each element is correspondingly made smaller, the area for the memory cells is reduced and the area of the flat part of the storage node electrode is reduced, thus making it more difficult to produce a capacitor having a large capacitance.

To eliminate the disadvantages, it is proposed to make the storage node electrode thicker to increase the area of its side part. This proposal however, presents the problem that, as the thickness of the storage node electrode is increased, the step difference of the storage electrode is increased. Thus, it becomes difficult to carry out the subsequent processes, in particular, the etching process.

In order to avoid this problem, it has been suggested that the storage node electrode should be made in the form of a multi-layer fin as schematically shown in FIG. 16.

This structure is effective to increase the capacitor area. However as the cell becomes smaller, its effectiveness decreases. The reason is as follows. As the cell becomes smaller the ratio of the side wall part area to the entire storage electrode area is increased. Accordingly, in the storage node electrode of a fin structure, the area of the side walls becomes smaller than that of a storage node electrode of a single-layer structure having the same height.

As seen from the foregoing, even in the DRAM of the improved laminated memory cell structure, as the cells become smaller due to the high integration of a device, the memory-cell area and the area of flat part of the storage node electrode are decreased. Therefore, it is very difficult to form a capacitor having a sufficient capacitance.

SUMMARY OF THE INVENTION

In view of the above circumstances, it is an object of the present invention to provide a memory cell structure which can secure a sufficient capacitance of the capacitor even when a memory cell area is reduced.

In accordance with a DRAM of the present invention, the above object is attained by making a cavity in a storage node electrode and by forming a capacitor insulating film on the inner surface of the storage node electrode as well as its outer surface so that even the inner surface of the storage node electrode is used as a capacitor electrode.

In a DRAM fabricating method according to the present invention, three layers of a first conductor layer, an insulating film and a second conductor layer are sequentially formed as laminated, the three layers are patterned into a desired shape pattern, a third conductor layer is deposited on the three-layer pattern, an anisotropic etching is performed to cause the third conductor layer to remain only on the side walls of the pattern to thereby form a box-shaped conductor layer region, and a part of the box-shaped region is provided with an opening through which the insulating film is removed by an etching to thereby form the box-shaped storage node electrode having a cavity defined by the first, second and third conductor layers.

In accordance with a second method of the present invention, three layers of a first conductor layer, an insulating film and a second conductor layer are sequentially laminated, the three layers are patterned into a desired stripe-shape pattern, a third conductor layer is deposited on the three-layer pattern, an anisotropic etching is performed to cause the third conductive layer to remain on the side walls of the stripe-shaped pattern, a second patterning is performed in a direction perpendicular to the stripe-shaped pattern, and the inside insulating film is removed through an etching to thereby form the storage node electrode having a cavity defined by the first, second and third conductor layers.

With the above structures, since even the inner surface of a storage node electrode is used as a capacitor electrode, the surface area of the storage node electrode can be increased by an amount corresponding to the inner surface of the storage node electrode, and therefore the capacitance value of the capacitor can be increased. Thus even when a memory cell area is reduced, the capacitor has a sufficient capacitance value.

In addition, according to the above methods, steps of enlarging the surface area of the storage node electrode can be easily carried out.

BRIEF DESCRIPTION OF THE DRAWINGS

FIGS. 2 to 8 show steps of fabricating the DRAM of the laminated memory cell structure of FIG. 1;

FIG. 10(a) to FIG. 10(c) show a DRAM of a laminated memory cell structure in accordance with a third embodiment of the present invention;

FIG. 11(a) to FIG. 11(c) show a DRAM of a laminated memory cell structure in accordance with a fourth embodiment of the present invention;

FIGS. 12 to 14 show how to fabricate DRAMs of other embodiments of the present invention; and FIGS. 15 and 16 show a prior art DRAM.

DESCRIPTION OF THE PREFERRED EMBODIMENTS

Embodiments of the present invention will be explained in detail by referring to the attached drawings.

Figure 1C:
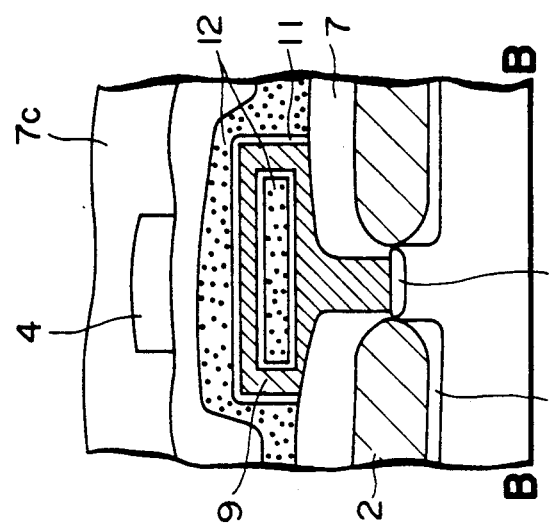
FIG. 1(a) to FIG. 1(c) show a DRAM of a laminated memory cell structure in accordance with an embodiment of the present invention.
Figure 1A:
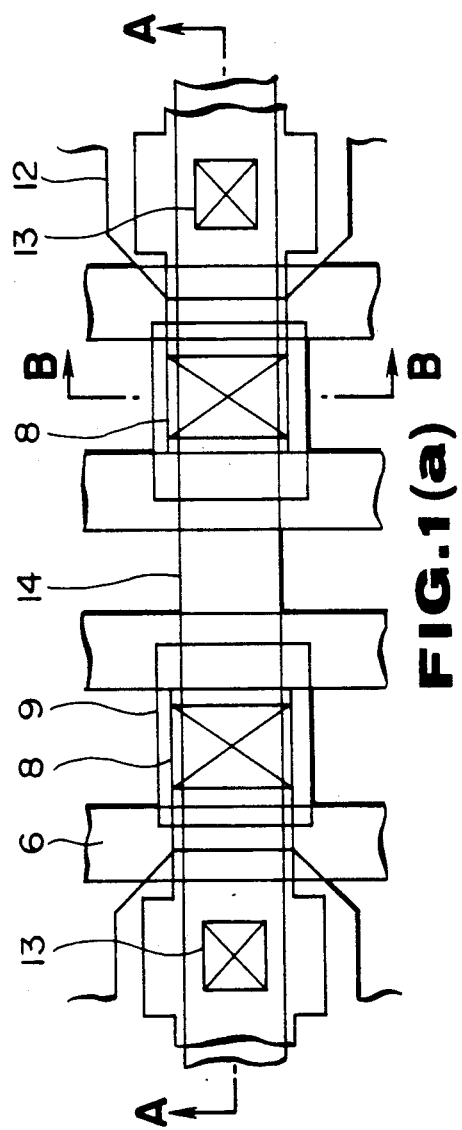
Figure 1B:
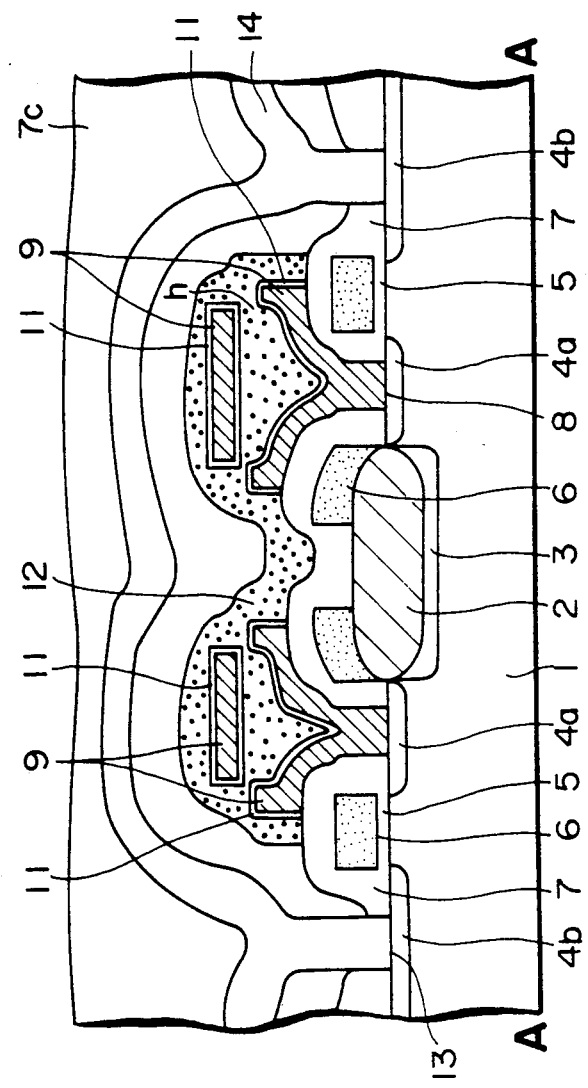

FIG. 1(a) is a plan view of a DRAM of a laminated memory cell structure of this embodiment in which adjacent two bits in the bit line direction are illustrated, FIG. 1(b) is a cross sectional view taken along line A—A' in FIG. 1(a), and FIG. 1(c) is a cross sectional view taken along line B—B' in FIG. 1(a).

This DRAM is featured in that a storage node electrode 9 is provided with a cavity which inner and outer surfaces are formed with a capacitor insulating film 11 and a plate electrode 12. Other parts are substantially the same as those of the prior art DRAM of the laminated memory cell structure.

More particularly, the laminated memory cell is arranged in an active area defined by an insulating film 2 for isolation between elements in a p-type silicon substrate, a gate electrode 6 is provided between adjacent source/drain regions 4a and 4b of an n-type diffusion layer with a gate insulating film 5 disposed between the gate electrode 6 and the source/drain regions 4a and 4b, thereby forming a MOSFET. Further formed on the MOSFET is a capacitor in such a manner as to contact with the source/drain region 4a through a storage node contact hole 8 provided an inter-layer insulating film 7 of silicon oxide. The capacitor comprises a box-shaped storage node electrode 9 having two openings in its upper side and contacted with the source/drain region 4a, a capacitor insulating film 11 and a plate electrode 12 formed on the inner side and the outer side of the storage node electrode 9.

A contact hole 13 for a bit line 14 is opened in the inter-layer insulating film 7 oxide at a portion covering the substrate 1. Bit line 14 is formed of a composite film of a heavily doped polycrystalline silicon layer and a molybdenum silicide film and is connected to the source/drain region 4b through the contact hole 13.

At the bottom of the element-isolation insulating film 2, a p-type diffusion layer 3 is formed for punch-through stop.

Explanation will then be made as to how to fabricate this DRAM with reference to the drawings.

First, within a p-type silicone substrate 1 having a resistivity of 5Ωcm, an element-isolation insulating film 2 and a p-type diffusion layer 3 for punch-through stop are formed by an ordinary LOCOS method. Then, a silicon oxide layer 5 of 10 nm thickness as a gate insulating film 5 and a polycrystalline silicon layer of 300 nm thickness as a gate electrode 6 are formed by a thermal oxidation method and then are subjected to a patterning by the photolithographic process and the reactive ion etching process. Thereafter, phosphorus (P) and arsenic (As) ions are injected into the silicone substrate 1 with use of the gate electrode 6 as a mask to form source/drain regions 4a and 4b of an n-type diffusion layer, whereby a MOSFET as a switching transistor is formed. Referring to FIG. 2(a) to FIG. 2(c), a BPSG film for example is deposited on the MOSFET by a CVD (chemical vapor deposition) method and then is subjected to a heat treatment to its flat surface, thus forming an inter-layer insulating film 7a having a flat top surface. Further, an inter-insulating film 7b is deposited on the inter-layer insulating film 7a by the CVD method.

Figure 3A:
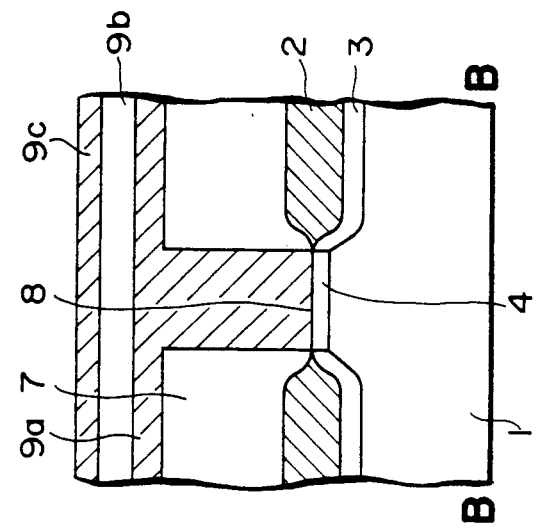
Figure 3B:
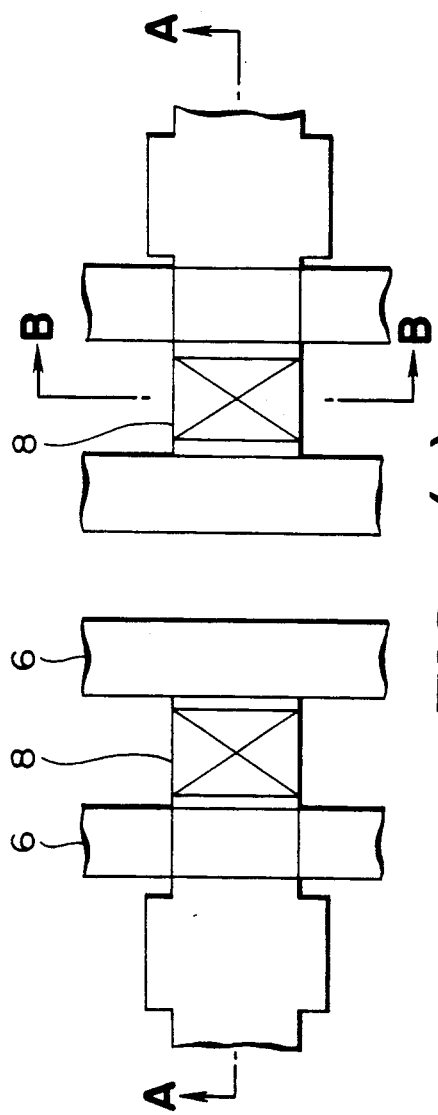
Figure 3C:
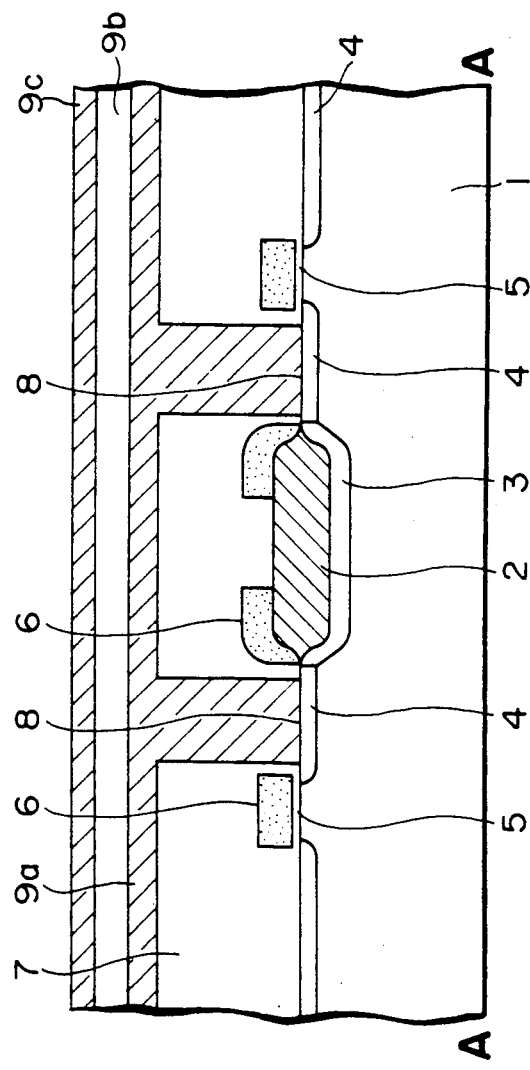

Thereafter, as shown in FIG. 3(a), to FIG. 3(c), the inter-layer insulating film 7a is selectively removed to form a storage node contact hole 8 by the photolithographic process and the reactive ion etching method, a polycrystalline silicon film 9a of 200 nm thickness is deposited on the entire surface of the insulating film 7a and then is subjected to a doping process of As ions or the like. On the doped film 9a, a silicon oxide film 9b of 100 nm and a polycrystalline silicone film 9c of 200 nm are deposited by the CVD method and then are subjected to a doping of As ions or the like.

Figure 4A:
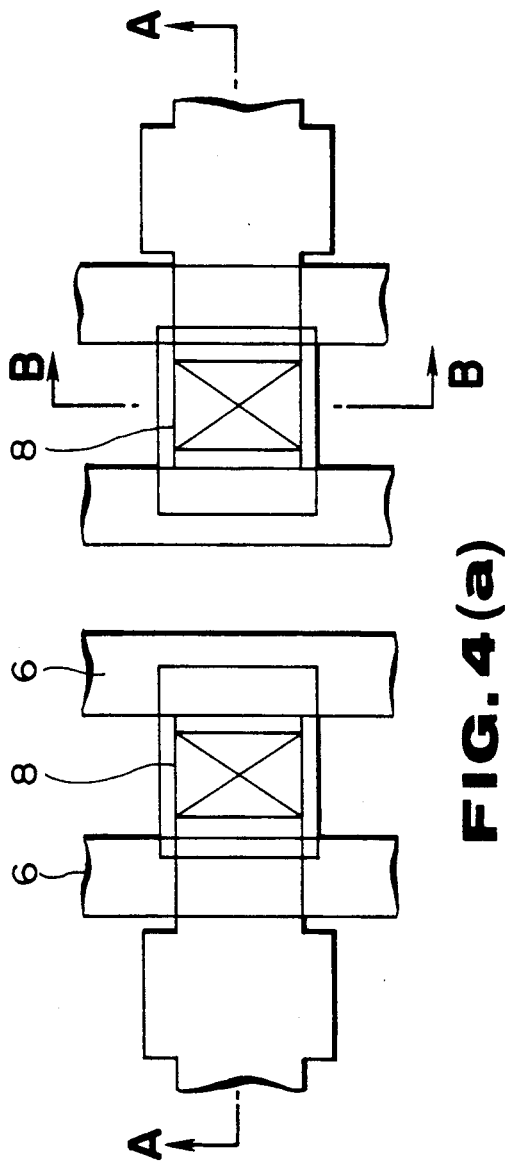
Figure 4C:
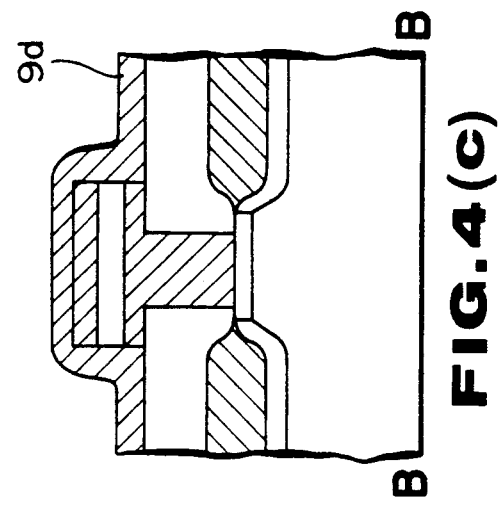
Figure 4B:
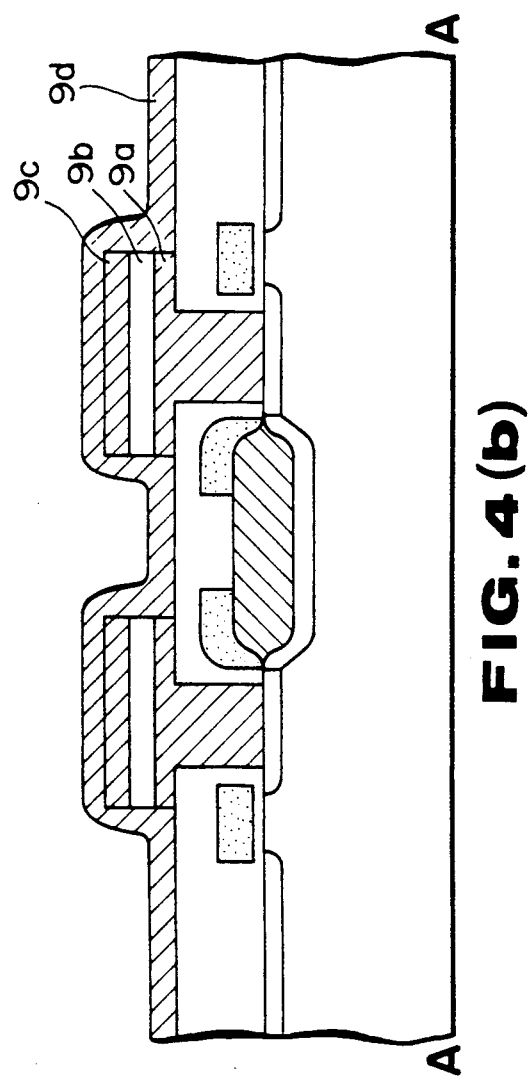

Referring to FIG. 4(a) to FIG. 4(c), the polycrystalline silicone film 9c, silicon oxide film 9b and polycrystalline silicon film 9a are sequentially subjected to a patterning by the photolithographic and reactive ion etching processes, on which a polycrystalline silicone film 9d of 100 nm thickness is deposited, which is further subjected to a doping of As ions or the like.

Subsequently, the polycrystalline silicone film 9d is subjected to an anisotropic etching process so that the polycrystalline silicone film 9d remains only at side walls of the patterned polycrystalline silicone film 9c, silicon oxide film 9b and polycrystalline silicon film 9a, thereby to form the storage node electrodes 9 as shown in FIG. 5(a) to FIG. 5(c).

Figure 6A:
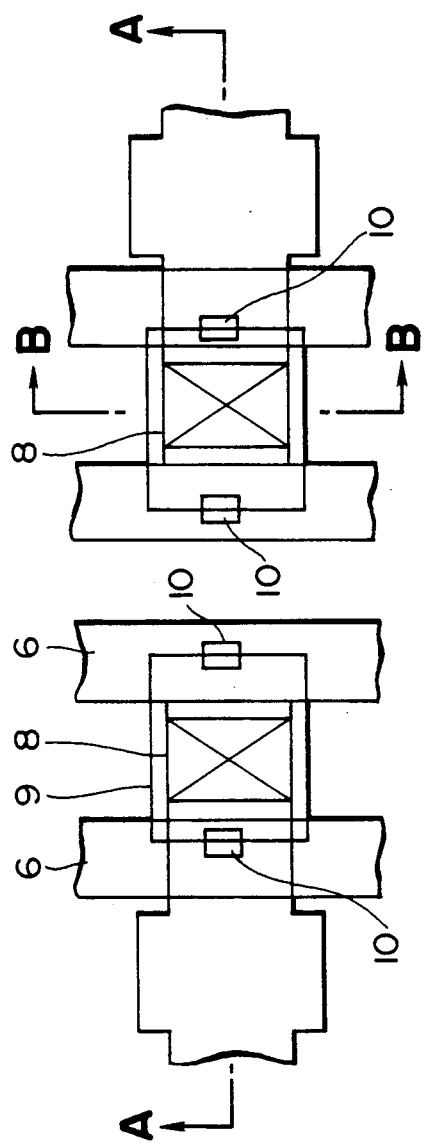
Figure 6C:
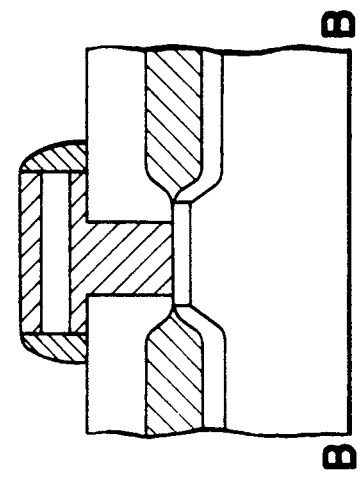
Figure 6B:
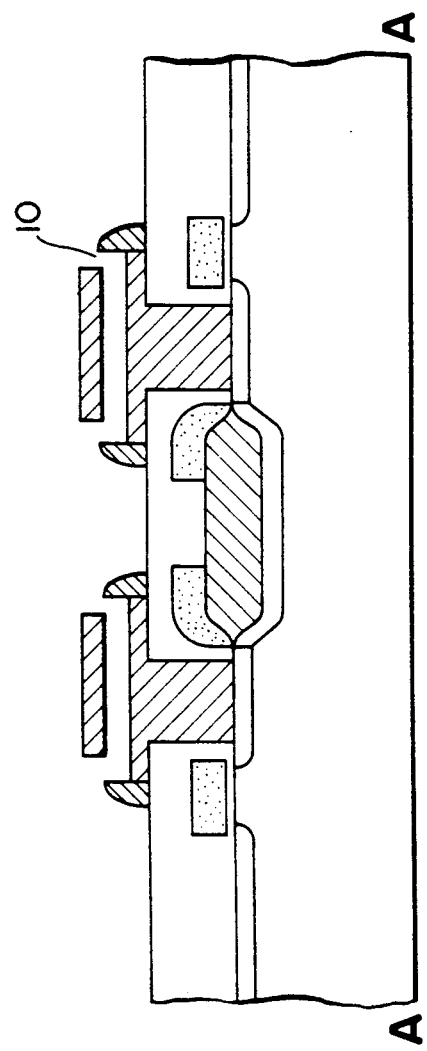

Next, holes 10 are opened in the storage node electrodes 9 by the photolithographic and reactive ion etching methods through which polycrystalline silicone film 9b is removed with use of ammonium fluoride water, as shown in FIG. 6(a) to FIG. 6(c).

Thereafter, a silicon nitride film of about 10 nm thickness is deposited on the entire surface by the CVD method and then subjected to an oxidation in a steam atmosphere at 950° C. for about 30 minutes to form a capacitor insulating film 11 of two-layer structure made of a silicon oxide film and a silicon nitride film. Further deposited on the entire surface of the capacitor insulating film 11 is a polycrystalline silicon film which in turn is subjected to a doping process. The silicon film is then subjected to a patterning by the photolithographic and reactive ion etching processes to form a plate electrode 12. As shown in FIG. 7(a) to FIG. 7(c), unnecessary parts of the capacitor insulating films 11 are removed with use of the plate electrode 12 as a mask. Then, an inter-insulating film 7b made of silicon oxide is deposited. With the steps stated above, the capacitor insulating film 11 and plate electrode 12 are provided even within the storage node electrode 9.

After this, as shown in FIG. 8(a) to FIG. 8(c), a bit-line contact hole 13 is opened by the photolithographic and reactive ion etching processes, and a composite film made up of a polycrystalline silicon film doped with arsenic and the like and a molybdenum silicide film is deposited. The composite film is subjected to the photolithographic and reactive ion etching processes to form a bit line 14.

Thereafter, a silicon oxide film as an inter-layer insulating film 7c is formed. At this stage, a basic structure of the memory cell as shown in FIG. 1(a) to FIG. 1(c) is completed.

With the aforementioned structure, the area of the capacitor is a sum of the areas of inner and outer surfaces of the storage node electrode 9. Accordingly, the area of the storage node electrode is increased to a large extent and the capacitance value of the capacitor is increased.

Explanation will next be made as to a second embodiment of the present invention.

Figure 9A:
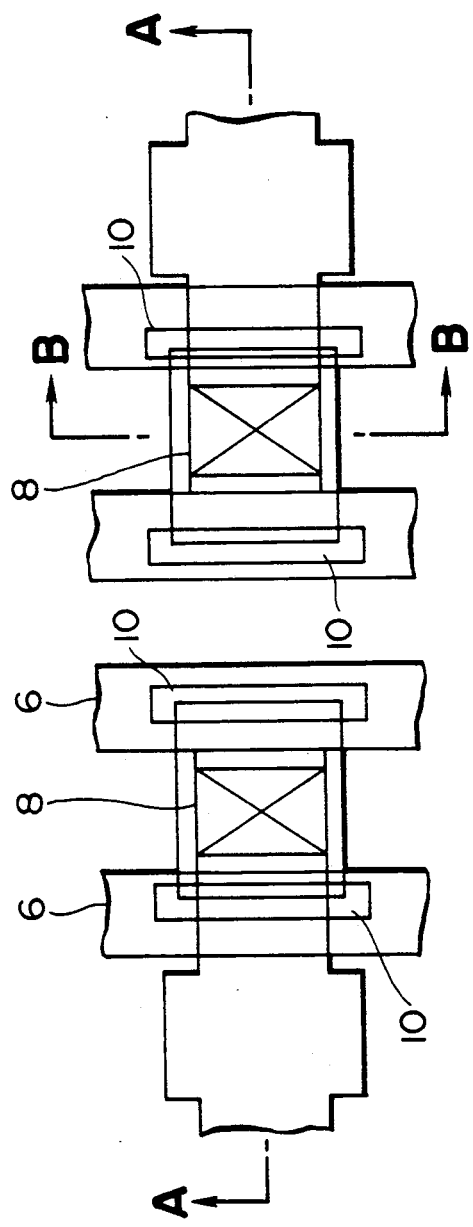
FIG. 9(a) to FIG. 9(c) show a DRAM of a laminated memory cell structure in accordance with a second embodiment of the present invention.
Figure 9C:
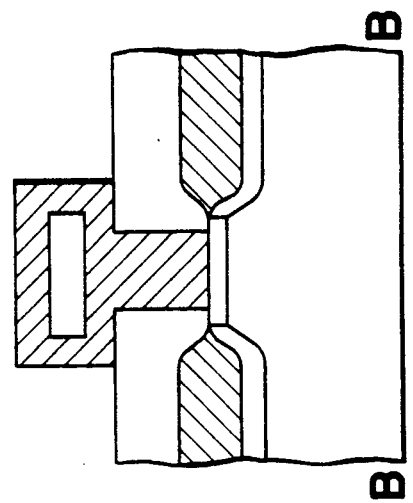
Figure 9B:
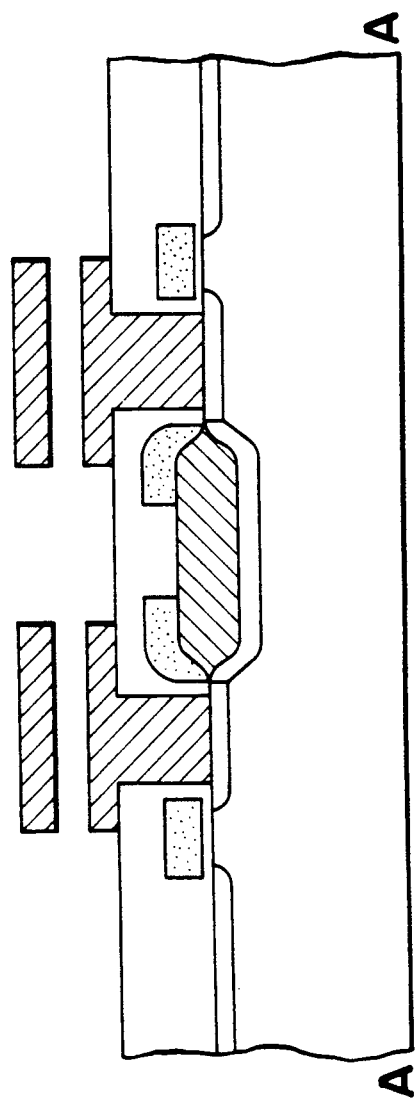
Figure 16:
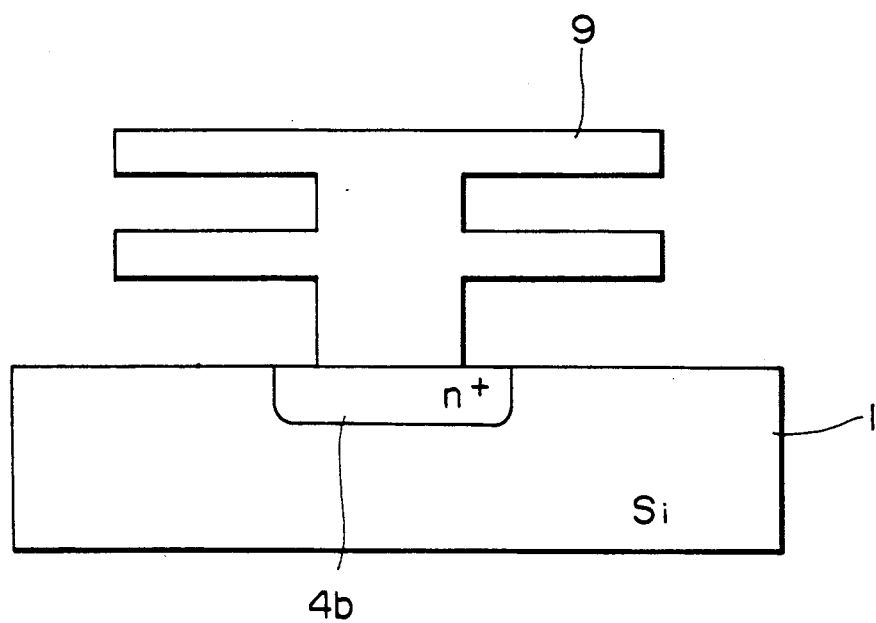

In this embodiment, a storage node electrode is made in the form of a pipe laid on its side as shown in FIG. 9(a) to FIG. 9(c).

The storage node electrode of this embodiment is fabricated as follows. That is, in the aforementioned step of making the opening in the storage node electrode as shown in FIG. 6(a) to FIG. 6(c) in the first embodiment, the storage node electrode is, in this embodiment, subjected to an etching patterning process so that two sides thereof are cut off by removing portion of the polycrystalline silicon layers 9a, 9c and 9d. Other parts are formed in substantially the same manner as in the first embodiment.

With this structure, since the opening of the storage node electrode is wide, the silicon oxide film 9b can be easily removed and the capacitor insulating film and the plate electrode can be easily formed in the removed part.

According to a third embodiment of the present invention, a storage node electrode is made in the form of a cup laid on its side as shown in FIG. 10(a) to FIG. 10(c).

The storage node electrode of this embodiment is fabricated as follows. That is, in the aforementioned step of making the opening in the storage node electrode as shown in FIG. 6(a) to FIG. 6(c) in the first embodiment, the storage node electrode is, in the this embodiment, subjected to an etching patterning process to cut off one side of the storage node electrode by removing that portion of the polycrystalline silicon layers 9a, 9c and 9d. Other parts are formed in substantially the same manner as in the first embodiment.

Even with this structure, since the opening of the storage node electrode is wider than that in the first embodiment, the silicon oxide film can be easily removed and the capacitor insulating film and plate electrode can be easily formed in the removed part.

In a fourth embodiment of the present invention, the storage node electrode is of a multi-layer structure as shown in FIG. 11(a) to FIG. 11(c).

The storage node electrode of this embodiment is fabricated as follows. That is, after formation of the polycrystalline silicon film 9c as shown in FIG. 3(a) to FIG. 3(c) in the first embodiment, a silicon oxide film (not shown) and a polycrystalline silicon film 9e are deposited on the film 9c in this embodiment. Other parts are formed in substantially the same manner as in the first embodiment. In this embodiment, however, the opening making step is also performed to the newly added silicon oxide film (not shown) and polycrystalline silicon film 9e.

Since the storage node electrode is in the form of a multi-layer structure, the charge storage area is further increased. When the number of layers is increased to 3 layers, 4 layers and so on, the charge storage area can be additionally increased.

The fabricating method of the semiconductor device of the present invention is not limited to the fabricating method of the first embodiment and may be suitably modified.

For example, after the polycrystalline silicon film 9c of 200 nm thickness is deposited and then doped with As ions or the like ions as shown in FIG. 3(a) to FIG. 3(c) in the first embodiment, a resist pattern 15 is formed parallel to its channel length direction and then a polycrystalline silicon film 9c, a silicon oxide film 9b and a polycrystalline silicon film 9a are sequentially subjected to a patterning with use of the resist pattern 15 as a mask as shown in FIG. 12(a) to FIG. 12(c).

After the resist pattern 15 is removed, a polycrystalline silicon film 9d of 100 nm thickness is deposited thereon and thereafter doped with As ions and the like.

Subsequently, the polycrystalline silicon film 9d is subjected to an anisotropic etching process so that the polycrystalline silicon film 9d remains only on the side walls of the polycrystalline silicon film 9c, silicon oxide film 9b and polycrystalline silicon film 9a as shown in FIG. 13(a) to FIG. 13(c).

After this, a resist pattern is formed perpendicular to the channel length direction and the polycrystalline silicone film 9c, silicon oxide film 9b and polycrystalline silicon films 9a and 9d are subjected to a patterning with use of the resist pattern as a mask to form a storage node electrode 9 as shown in FIG. 14(a) to FIG. 14(c).

The resultant structure of FIG. 14(a) to FIG. 14(c) is then subjected to the etching step of removing the polycrystalline silicone film 9b within the storage node electrode 9 with use of ammonium fluoride aqueous solution, and then the subsequent steps as shown in FIGS. 6 to 8 are performed.

In this method, the photolithographic step of making the opening in the storage node electrode can be eliminated.

The present invention is directed to the structure of the storage node electrode in the DRAM of laminated capacitor structure and the method of forming the storage node electrode, the structure and the method may be suitably modified in various ways so long as the modifications are made within the scope of the present invention as defined by the appended claims.

Further, the capacitor insulating film may be of a metal oxide film such as a silicon oxide film or a tantalum pentoxide ($Ta_2O_5$), rather than the two-layer structure film of the silicon oxide film and silicon nitride film as described above.

The gate electrode and the storage node contact hole, or the gate electrode and the bit line contact hole, plate electrode and bit line contact hole may be formed in a self alignment manner.

Furthermore, the monocrystalline silicon, tungsten or the like may be selectively grown in the contact hole to reduce the step difference in the bit line contact hole.

Although the foregoing explanation has been made as to the structure wherein the bit line is formed on the plate electrode, the bit line may be first formed and then the storage node electrode may be formed on the bit line.

What is claimed is:

1. A semiconductor memory device of a laminated capacitor structure comprising:
   a MOSFET comprising a gate electrode, a source region and a drain region formed on a surface of a substrate;
   a word line connected to the gate electrode;
   a bit line connected to one of the source region and the drain region of the MOSFET through a bit line contact hole opened in an insulating film covering the MOSFET; and
   a capacitor comprising a storage node electrode, a capacitor insulating film and a plate electrode;
   wherein the storage node electrode is connected to another one of the source region and the drain region through a storage node contact hole opened in the insulating film and has at least one cavity, the capacitor insulating film is formed on an outer surface of the storage node electrode and an inner surface of the cavity, and the plate electrode is formed on the capacitor insulating film covering both the outer surface of the storage node electrode and the capacitor insulating film covering the inner surface of the cavity.

2. A semiconductor memory device as set forth in claim 1, wherein the storage node electrode is in the form of a box.

3. A semiconductor memory device as set forth in claim 1, wherein the storage node electrode is in the form of a pipe laid on its side.

4. A semiconductor memory device as set forth in claim 1, wherein the storage node electrode is in the form of a cup laid on its side.

5. A semiconductor memory device as set forth in claim 1, wherein the storage node electrode comprises a plurality of layers, surfaces of which are contacted with the capacitor insulating film.

6. A semiconductor memory device as set forth in claim 1, wherein the storage node electrode is formed in a self alignment manner with respect to a gate electrode of the MOSFET.

7. A semiconductor memory device as set forth in claim 1, wherein the bit line contact hole is formed in a self alignment manner with respect to the gate electrode of the MOSFET.

8. A semiconductor memory device as set forth in any of claims 1 to 7, wherein the capacitor is formed above the bit line.

9. A semiconductor memory device as set forth in claim 8, wherein the storage node contact hole is formed in a self alignment manner with respect to the bit line contact hole.

10. A semiconductor memory device as set forth in any of claims 1 to 7, wherein the capacitor is formed below the bit line.

11. A semiconductor memory device as set forth in claim 10, wherein the bit line contact hole is formed in a self alignment manner with respect to the plate electrode.

* * * * *